(12) United States Patent
Guzman-Casillas et al.

(10) Patent No.: US 11,307,264 B2
(45) Date of Patent: Apr. 19, 2022

(54) PHASE SELECTION FOR TRAVELING WAVE FAULT DETECTION SYSTEMS

(71) Applicant: Schweitzer Engineering Laboratories, Inc., Pullman, WA (US)

(72) Inventors: Armando Guzman-Casillas, Pullman, WA (US); Bogdan Z. Kasztenny, Markham (CA); Mangapathirao Venkata Mynam, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 479 days.

(21) Appl. No.: 15/621,783

(22) Filed: Jun. 13, 2017

(65) Prior Publication Data

US 2017/0356965 A1   Dec. 14, 2017

Related U.S. Application Data

(60) Provisional application No. 62/349,902, filed on Jun. 14, 2016.

(51) Int. Cl.
*G01R 31/52* (2020.01)
*G01R 31/08* (2020.01)
(Continued)

(52) U.S. Cl.
CPC ............. *G01R 31/52* (2020.01); *G01R 31/08* (2013.01); *G01R 31/085* (2013.01); *G01R 31/42* (2013.01);
(Continued)

(58) Field of Classification Search
None
See application file for complete search history.

(56) References Cited

U.S. PATENT DOCUMENTS

| 3,585,298 A | 6/1971 | Liberman |
| 3,670,240 A | 6/1972 | Maranchak |

(Continued)

FOREIGN PATENT DOCUMENTS

| AU | 2014271281 A1 * | 1/2015 |
| AU | 2014271282 A1 * | 1/2015 |

(Continued)

OTHER PUBLICATIONS

Machine Translation for RU2557017 (Year: 2015).*
(Continued)

*Primary Examiner* — Eman A Alkafawi
*Assistant Examiner* — Leonard S Liang
(74) *Attorney, Agent, or Firm* — Justin K. Flanagan; Richard M. Edge

(57) ABSTRACT

Phase selection for traveling wave fault detection systems is disclosed herein. Intelligent electronic devices (IEDs) may be used to monitor and protect electric power delivery systems by detecting and acting upon traveling waves. A phase of the electric power delivery system may be selected based on the relative polarity of the traveling waves detected. The amplitude and/or polarity of the selected phase may be compared with the amplitudes and/or polarities of the other phases to determine a fault condition. For instance, the IED may determine a single-phase-to-ground fault based on the relative polarities and magnitudes of the detected traveling waves, send a protective action to the identified faulted phase, and/or continue to monitor the system for a continuation of the event or identification of a different event, such as a three-phase fault, using incremental quantities.

12 Claims, 10 Drawing Sheets

(51) Int. Cl.
  *G01R 31/42* (2006.01)
  *G05B 19/048* (2006.01)
  *H02H 7/26* (2006.01)
  *G01R 31/11* (2006.01)
  *G01R 19/25* (2006.01)

(52) U.S. Cl.
  CPC ........ *G05B 19/048* (2013.01); *G01R 19/2513* (2013.01); *G01R 31/081* (2013.01); *G01R 31/086* (2013.01); *G01R 31/088* (2013.01); *G01R 31/11* (2013.01); *G05B 2219/21155* (2013.01); *H02H 7/26* (2013.01); *H02H 7/265* (2013.01)

(56) References Cited

U.S. PATENT DOCUMENTS

| | | | |
|---|---|---|---|
| 3,878,460 A | 4/1975 | Nimmersjö | |
| 3,890,544 A | 6/1975 | Chamia | |
| 3,956,671 A | 5/1976 | Nimmersjö | |
| 4,053,816 A | 10/1977 | Nimmersjö | |
| 4,254,444 A | 3/1981 | Eriksson | |
| 4,275,429 A * | 6/1981 | Church | H02H 7/263 361/64 |
| 4,296,452 A | 10/1981 | Eriksson | |
| 4,344,142 A | 8/1982 | Diehr | |
| 4,351,011 A * | 9/1982 | Liberman | G01R 31/086 361/82 |
| 4,352,137 A * | 9/1982 | Johns | H02H 7/265 361/82 |
| 4,366,474 A * | 12/1982 | Loewenstein | G01R 27/16 340/651 |
| 4,377,834 A | 3/1983 | Eriksson | |
| 4,438,475 A * | 3/1984 | Haley | H02H 7/265 324/522 |
| 4,475,079 A * | 10/1984 | Gale | G01R 31/11 324/533 |
| 4,499,417 A * | 2/1985 | Wright | G01R 31/088 324/522 |
| 4,626,772 A | 12/1986 | Michel | |
| 4,766,549 A | 8/1988 | Schweitzer | |
| 4,795,983 A * | 1/1989 | Crockett | G01R 27/18 324/521 |
| 4,797,805 A | 1/1989 | Nimmersjö | |
| 4,800,509 A | 1/1989 | Nimmersjö | |
| 4,935,837 A * | 6/1990 | Sun | H02H 7/261 361/64 |
| 5,198,746 A | 3/1993 | Gyugyi | |
| 5,428,549 A * | 6/1995 | Chen | G01R 31/088 361/80 |
| 5,446,387 A | 8/1995 | Eriksson | |
| 5,455,776 A * | 10/1995 | Novosel | G01R 31/088 324/509 |
| 5,552,952 A * | 9/1996 | Kramer | H02H 7/1255 361/47 |
| 5,572,138 A | 11/1996 | Nimmersjö | |
| 5,661,664 A * | 8/1997 | Novosel | H02H 3/402 324/512 |
| 5,682,100 A | 10/1997 | Rossi | |
| 5,729,144 A | 3/1998 | Cummins | |
| 5,773,980 A * | 6/1998 | Yang | G01R 31/088 324/522 |
| 6,341,055 B1 | 1/2002 | Guzman-Casillas | |
| 6,417,791 B1 | 7/2002 | Benmouyal | |
| 6,477,475 B1 | 11/2002 | Takaoka | |
| 6,597,180 B1 | 7/2003 | Takaoka | |
| 6,798,211 B1 | 9/2004 | Rockwell | |
| 7,174,261 B2 | 2/2007 | Gunn | |
| 7,535,233 B2 | 5/2009 | Kojovic | |
| 7,630,863 B2 * | 12/2009 | Zweigle | G01R 19/2513 702/177 |
| 7,714,735 B2 * | 5/2010 | Rockwell | G01R 19/2513 324/126 |
| 7,733,094 B2 | 6/2010 | Bright | |
| 8,289,668 B2 * | 10/2012 | Kasztenny | H02H 3/28 361/87 |
| 8,315,827 B2 | 11/2012 | Faybisovich | |
| 8,525,522 B2 | 9/2013 | Gong | |
| 8,598,887 B2 | 12/2013 | Bjorklund | |
| 8,655,608 B2 * | 2/2014 | Guzman-Casillas | G01R 31/088 324/522 |
| 8,655,609 B2 | 2/2014 | Schweitzer | |
| 8,781,766 B2 | 7/2014 | Schweitzer | |
| 8,823,307 B2 * | 9/2014 | Gajic | G01R 31/343 318/490 |
| 8,942,954 B2 * | 1/2015 | Gong | G01R 31/085 702/185 |
| 8,990,036 B1 | 3/2015 | Schweitzer | |
| 9,470,748 B2 | 10/2016 | Schweitzer | |
| 9,594,112 B2 * | 3/2017 | Schweitzer, III | G01R 31/2836 |
| 9,627,881 B2 | 4/2017 | Schweitzer | |
| 9,784,783 B2 * | 10/2017 | Seibel | G01R 31/086 |
| 10,191,102 B2 * | 1/2019 | Weiher | H02H 3/165 |
| 10,295,586 B2 * | 5/2019 | Li | G01R 31/08 |
| 10,310,004 B2 * | 6/2019 | Schweitzer, III | H02H 1/0092 |
| 10,641,815 B2 * | 5/2020 | Kasztenny | H02H 7/20 |
| 10,677,834 B2 * | 6/2020 | Kasztenny | G01R 31/088 |
| 2001/0012984 A1 * | 8/2001 | Adamiak | G01R 19/25 702/58 |
| 2002/0053912 A1 * | 5/2002 | Saha | G01R 31/088 324/525 |
| 2002/0165462 A1 | 11/2002 | Westbrook | |
| 2004/0189317 A1 | 9/2004 | Borchert | |
| 2004/0230387 A1 | 11/2004 | Bechhoefer | |
| 2005/0151659 A1 | 7/2005 | Donovan | |
| 2006/0012374 A1 * | 1/2006 | Kojovic | G01R 31/088 324/522 |
| 2006/0187074 A1 * | 8/2006 | O'Sullivan | G01R 15/142 340/660 |
| 2008/0071482 A1 * | 3/2008 | Zweigle | G01R 19/2513 702/62 |
| 2008/0077336 A1 | 3/2008 | Fernandes | |
| 2008/0150544 A1 * | 6/2008 | Premerlani | G01R 27/18 324/521 |
| 2009/0089608 A1 * | 4/2009 | Guzman-Casillas | G01R 29/18 713/340 |
| 2009/0230974 A1 | 9/2009 | Kojovic | |
| 2009/0231769 A1 * | 9/2009 | Fischer | H02H 3/286 361/87 |
| 2011/0058285 A1 | 3/2011 | Wibben | |
| 2011/0082653 A1 * | 4/2011 | Balcerek | G01R 31/088 702/59 |
| 2011/0173496 A1 | 7/2011 | Hosek | |
| 2011/0248721 A1 * | 10/2011 | Higgins | G01R 31/1272 324/537 |
| 2011/0264388 A1 * | 10/2011 | Gong | G01R 31/086 702/58 |
| 2012/0086459 A1 * | 4/2012 | Kim | G01R 29/18 324/522 |
| 2012/0150460 A1 * | 6/2012 | Balcerek | H02H 3/34 702/58 |
| 2013/0021039 A1 * | 1/2013 | Bjorklund | G01R 31/088 324/535 |
| 2013/0096854 A1 * | 4/2013 | Schweitzer, III | G01R 31/085 702/59 |
| 2013/0100564 A1 | 4/2013 | Zhang | |
| 2013/0241622 A1 | 9/2013 | Zerbe | |
| 2014/0074414 A1 | 3/2014 | Schweitzer, III | |
| 2014/0320139 A1 * | 10/2014 | Renforth | G01R 31/11 324/415 |
| 2015/0081234 A1 * | 3/2015 | Schweitzer, III | G01R 31/088 702/58 |
| 2015/0081235 A1 * | 3/2015 | Schweitzer, III | G01R 31/088 702/59 |
| 2015/0081236 A1 * | 3/2015 | Schweitzer, III | G01R 27/16 702/59 |
| 2015/0212139 A1 * | 7/2015 | Smith | G01R 31/52 324/509 |
| 2016/0061873 A1 * | 3/2016 | Liu | G01R 31/088 702/59 |

(56) References Cited

U.S. PATENT DOCUMENTS

| | | | |
|---|---|---|---|
| 2016/0077149 A1* | 3/2016 | Schweitzer, III | G01R 31/2836 307/131 |
| 2016/0077150 A1 | 3/2016 | Schweitzer | |
| 2016/0084893 A1 | 3/2016 | Schweitzer | |
| 2016/0187406 A1* | 6/2016 | Liu | G01R 31/58 702/58 |
| 2016/0216306 A1* | 7/2016 | Weiher | H02H 3/165 |
| 2016/0216310 A1* | 7/2016 | Schweitzer, III | G01R 31/088 |
| 2016/0274169 A1* | 9/2016 | Cui | H02H 7/261 |
| 2017/0012424 A1 | 1/2017 | Schweitzer | |
| 2017/0082675 A1* | 3/2017 | Schweitzer, III | H04B 3/46 |
| 2017/0102426 A1* | 4/2017 | Schweitzer, III | G01R 31/086 |
| 2017/0102444 A1* | 4/2017 | Whitehead | G01R 31/11 |
| 2017/0104324 A1* | 4/2017 | Schweitzer, III | G01R 31/085 |
| 2017/0110875 A1* | 4/2017 | Schweitzer, III | H02H 7/265 |
| 2017/0117701 A1* | 4/2017 | Johannesson | H02H 7/265 |
| 2017/0146613 A1 | 5/2017 | Schweitzer | |
| 2017/0358913 A1* | 12/2017 | Kasztenny | H02H 3/30 |
| 2018/0083437 A1* | 3/2018 | Schweitzer, III | H02H 1/0092 |
| 2018/0210060 A1* | 7/2018 | Guzman-Casillas | G01R 35/00 |
| 2020/0350760 A1* | 11/2020 | Schweitzer, III | H02H 7/20 |

FOREIGN PATENT DOCUMENTS

| | | |
|---|---|---|
| EP | 226210 | 12/1986 |
| EP | 241832 | 7/1990 |
| EP | 164711 | 12/1991 |
| EP | 244649 | 4/1992 |
| EP | 627085 | 12/2005 |
| GB | 1463755 | 2/1977 |
| WO | 9519060 | 7/1995 |
| WO | 2007135073 | 11/2007 |
| WO | 2010099585 | 9/2010 |
| WO | 2013119315 | 8/2013 |

OTHER PUBLICATIONS

Taylor, Gerald Austin; "Design and Analysis of a Traveling Wave Fault Locator"; Louisiana Tech Digital Commons; Summer Aug. 2019. (Year: 2019).*

Marx, Stephen; Johnson, Brian K.; Guzman, Armando; Skendzic, Veselin; and Mynam, Mangapathirao V.; "Traveling Wave Fault Location in Protective Relays: Design, Testing, and Results" (Year: 2013).*

Wikipedia entry for "Symmetrical components" (snapshot taken of Apr. 21, 2016 entry); web.archive.org/web/20160421233422/https://en.wikipedia.org/wiki/Symmetrical_components (Year: 2016).*

Harshad Mehta, Fault Location Techniques for High-Voltage DC Lines, EPRI EL-4331 Project 2150-1, 1985.

Masaoki Ando, Edmund O. Schweitzer III, R. A. Baker, Development and Field-Data Evaluation of Single-End Fault Locator for Two-Terminal HVDC Transmission Lines, IEEE Transactions on Power Apparatus and Systems, vol. PAS-104, No. 12, 1985.

Masaoki Ando, Fault Location Techniques for HVDC Lines: Analysis, Development, Simulation, and Field-Data Evaluation, 1984.

P.F. Gale, Overhead Line Fault Location Based On Travelling Waves & GPS, 1993.

Harry Lee, Development of an Accurate Transmission Line Fault Locator Using the Glabal Positioning System and Satellites, 1994.

Hewlett Packard, Traveling Wave Fault Location in Power Transmission Systems, Application Note 1285, 1997.

Michael A. Street, Delivery and Application of Precise Timing for a Traveling Wave Powerline Fault Locator System, 1990.

Sergio Luiz Zimath, Marco Antonio Ramos, Jayme Silva Filho, Joaquim Moutinho Beck, Nei Mueller, Traveling Wave-Based Fault Location Experiences, 2010.

Qualitrol Corporation, Telefault TWS Traveling Wave Fault Locator, Qualitrol Brochure 2004.

PCT/US2012/060089 Patent Cooperation Treaty, International Search Report and Written Opinion of the International Searching Authority, dated Feb. 5, 2013.

Elhaffar, Power Transmission Line Fault Location Based on Current Traveling Waves. TKK Dissertations 107, Espoo 2008, Helsinki University of Technology. Department of Electrical Engineering, Dec. 2008.

Reason International, Inc., Traveling Wave Fault Location in Power Transmission Systems, White Paper.

Carlos Alberto Dutra, Rafael Rosar Matos, Sergio Luiz Zimath, Jurandir Paz De Oliveira, Joao Henrique Monteiro De Resende, Joaquim Amerigo Pinto Moutinho, Fault Location by Traveling Waves: Application in High Impedance Events.

N. Fischer, V. Skendzic, R. Moxley, J. Needs, Protective Relay Traveling Wave Fault Location, Feb. 9, 2012.

PCT/US2014/055894 Patent Cooperation Treaty, International Search Report and Written Opinion of the International Searching Authority, dated Dec. 17, 2014.

PCT/US2014/055896 Patent Cooperation Treaty, International Search Report and Written Opinion of the International Searching Authority, dated Dec. 18, 2014.

PCT/US2014/055919 Patent Cooperation Treaty, International Search Report and Written Opinion of the International Searching Authority, dated Dec. 22, 2014.

Borghetti, et al., "On the use of continuous-wavelet transform for fault location in distribution power systems." International Journal of Electrical Power & Energy Systems. Nov. 2006.

Maher M.I. Hashim, Hew Wooi Ping, V.K. Ramachandaramurthy, Impedance-Based Fault Location Techniques for Transmission Lines, Sep. 2009.

Zheng et al., Study on Impedance-Traveling Wave Assembled Algorithm in One-Terminal Fault Location System for Transmission Lines, Apr. 2008.

Gabriel Benmouyal, Karl Zimmerman, Experience With Subcycle Operating Time Distance Elements in Transmission Line Digital Relays, Presented at the 37th Annual Western Protective Relay Conference Oct. 2010.

Edmund O. Schweitzer, III, Armando Guzman-Casillas, Mangapathirao Venkat Mynam, Veselin Skendzic, Bogdan Kasztenny, Stephen Marx, Locating Faults by the Traveling Waves They Launch, Feb. 10, 2014.

Toshio Tahagi, Jun-Ichi Baba, Katauhiko Usmura, Tishiaki Sakaguchi, Fault Protection Based on Travelling Wave Theory—Part I Theory, Jan. 24, 1977.

PCT/US2015/050504 Patent Cooperation Treaty, International Search Report and Written Opinion of the International Searching Authority, dated Jan. 29, 2016.

He, Baina, Yunwei Zhao, and Hengxu Ha. "A Novel Wave Based Differential Protection for Distributed Parameter Line." Telkomnika Indonesian Journal of Electrical Engineering Telkomnika 11.9 (2013): 5097-104.

Tang, Lanxi; Dong, Xinzhou; Shi, Shenxing; Wang, Bin; "Travelling Wave Differential Protection Based on Equivalent Travelling Wave", 13th IET International Conference on Developments in Power System Protection (DPSP 2016), Mar. 7-10, 2016.

PCT/US2016/052329 Patent Cooperation Treaty, International Search Report and Written Opinion of the International Searching Authority, dated Jan. 6, 2017.

PCT/US2017/037345 Patent Cooperation Treaty, International Search Report and Written Opinion of the International Searching Authority, dated Aug. 24, 2017.

PCT/US2017/037288 Patent Cooperation Treaty, International Search Report and Written Opinion of the International Searching Authority, dated Aug. 28, 2017.

* cited by examiner

PHASE SELECTION FOR TRAVELING WAVE FAULT DETECTION SYSTEMS

RELATED APPLICATION

This application claims priority under 35 U.S.C. § 119(e) to U.S. Provisional Patent Application No. 62/349,902, filed Jun. 14, 2016, titled "PHASE SELECTION FOR TRAVELING WAVE FAULT DETECTION SYSTEMS," which is hereby incorporated by reference in its entirety.

TECHNICAL FIELD

This disclosure relates to phase selection for traveling wave fault detection systems. More particularly, this disclosure relates to detection of a fault on an electric power system using traveling waves and proper selection of the faulted phase. The disclosure herein presents fast protective and/or alarm actions using traveling waves with phase selection.

BRIEF DESCRIPTION OF THE DRAWINGS

This disclosure includes illustrative embodiments that are non-limiting and non-exhaustive. Reference is made to certain of such illustrative embodiments that are depicted in the figures described below.

DETAILED DESCRIPTION

Figure 1:
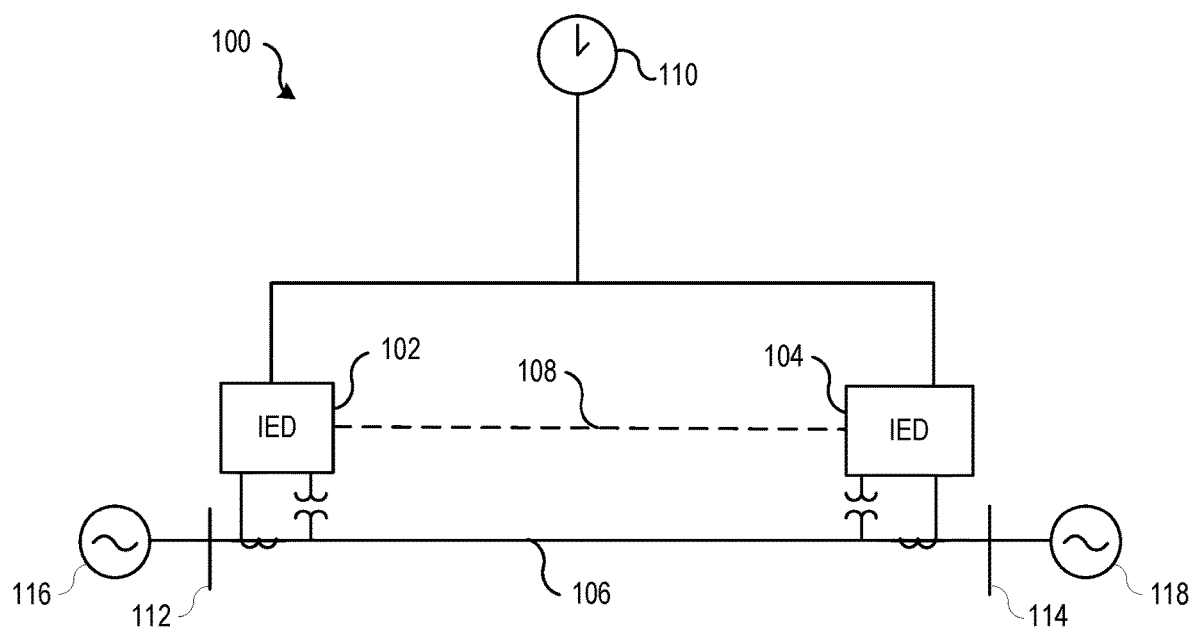
FIG. 1 illustrates an example of a simplified one-line diagram of an electric power system and system for protection thereof.

Faster transmission line protection improves power system stability. If faults are not cleared before the critical fault clearing time, the system may lose transient stability and possibly suffer a black out. In addition, faster fault clearing increases the amount of power that can be transferred through lines that are not thermally limited. Faster protection also enhances public and utility personnel safety, limits equipment wear, improves power quality, and reduces damage due to fault energy.

Ultra high-speed fault detection techniques using traveling waves and/or incremental quantities are described herein. Various events and conditions in the electric power system may launch traveling waves. Examples of such events and conditions include, but are not limited to, a phase-to-ground fault, a phase-to-phase fault, a three-phase fault, and the like. Systems and methods for fault detection using traveling waves and/or incremental quantities may be based on detecting traveling wave(s) and identifying the event that caused the traveling wave(s). The systems and methods may detect, measure, monitor, and/or otherwise utilize various incremental current quantities, incremental voltage quantities, and/or traveling waves launched by such conditions.

In some embodiments, the systems and methods include identifying unique signatures of traveling waves that correspond to specific events/conditions. Traveling wave phase polarity patterns on various phases during such conditions may be similar for different fault types. For example, the traveling waves on each of the three phases may be similar for a single-phase-to-ground fault as the traveling waves on each of the three phases for a three-phase fault. Accordingly, the systems and methods for fault detection described herein incorporate a phase selection subsystem.

Various components, subsystems, and portions of the embodiments, as generally described herein, including the descriptions below that reference the figures, could be arranged and designed in a wide variety of different configurations. For example, throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment. Features, functionalities, and elements described in the context of one embodiment can be utilized in conjunction with other embodiments as well.

The phrases "connected to" and "in communication with" refer to any form of interaction between two or more components, including mechanical, electrical, magnetic, and electromagnetic interaction. Two components may be connected to each other, even though they are not in direct contact with each other, and even though there may be intermediary devices between the two components.

As used herein, the term "IED" may refer to any microprocessor-based device that monitors, controls, automates, and/or protects monitored equipment within a system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, motor drives, and the like. IEDs may be connected to a network, and communication on the network may be facilitated by networking devices including, but not limited to, multiplexers, routers, hubs, gateways, firewalls, and switches. Furthermore, networking and communication devices may be incorporated in an IED or be in communication with an IED. The term "IED" may be used interchangeably to describe an individual IED or a system comprising multiple IEDs.

Some of the infrastructure that can be used with embodiments disclosed herein is already available, such as: general-purpose computers, computer programming tools and techniques, digital storage media, and communications networks. A computer may include a processor, such as a microprocessor, microcontroller, logic circuitry, or the like. The processor may include a special purpose processing device, such as an ASIC, PAL, PLA, PLD, Field Programmable Gate Array, or other customized or programmable device. The computer may also include a computer-readable storage device, such as non-volatile memory, static RAM, dynamic RAM, ROM, CD-ROM, disk, tape, magnetic, optical, flash memory, or other computer-readable storage medium.

Suitable networks for configuration and/or use, as described herein, include any of a wide variety of network infrastructures. Specifically, a network may incorporate landlines, wireless communication, optical connections, various modulators, demodulators, small form-factor pluggable (SFP) transceivers, routers, hubs, switches, and/or other networking equipment.

The network may include communications or networking software, such as software available from Novell, Microsoft, Artisoft, and other vendors, and may operate using TCP/IP, SPX, IPX, SONET, and other protocols over twisted pair, coaxial, or optical fiber cables, telephone lines, satellites, microwave relays, modulated AC power lines, physical media transfer, wireless radio links, and/or other data transmission "wires." The network may encompass smaller networks and/or be connectable to other networks through a gateway or similar mechanism.

Aspects of certain embodiments described herein may be implemented as software modules or components. As used herein, a software module or component may include any type of computer instruction or computer executable code located within or on a computer-readable storage medium. A software module may, for instance, comprise one or more physical or logical blocks of computer instructions, which may be organized as a routine, program, object, component, data structure, etc. that perform one or more tasks or implement particular data types.

A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media. Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network.

Some of the embodiments of the disclosure can be understood by reference to the drawings, wherein like parts are generally designated by like numerals. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments. Well-known structures, materials, or operations are not shown or described in detail to avoid obscuring aspects of this disclosure. In addition, the steps of a method do not necessarily need to be executed in any specific order, or even sequentially, nor need the steps be executed only once, unless otherwise specified.

FIG. 1 illustrates a block diagram of a system 100 for detecting and calculating a location of a fault using time-domain principles and elements described herein. The system 100 may include generation, transmission, distribution and/or similar systems. The system 100 includes a conductor 106, such as a transmission line connecting two nodes, which are illustrated as a local terminal 112 and a remote terminal 114. The local and remote terminals 112 and 114 may be buses in a transmission system supplied by generators 116 and 118, respectively. Although illustrated in single-line form for purposes of simplicity, the system 100 may be a multi-phase system, such as a three-phase electric power delivery system.

The system 100 is monitored by intelligent electronic devices (IEDs) 102 and 104 at two locations of the system. In various embodiments, additional IEDs may additionally or alternatively be utilized to monitor these or other locations of the system 100. The IEDs 102 and 104 may obtain electric power system information using current transformers (CTs), potential transformers (PTs), Rogowski coils, voltage dividers and/or the like. The IEDs 102 and 104 may be capable of using inputs from conventional instrument transformers such as CTs and PTs conventionally used in monitoring electric power systems. In some embodiments, IEDs may not utilize a common time source to provide protection. In other embodiments, and as illustrated, the IEDs 102 and 104 may receive common time information from a common time source 110. The common time source 110 may be any time source capable of delivering a common time signal to each of the IEDs 102 and 104. Examples of common time signals include, but are not limited to, a Global Navigational Satellite System (GNSS), such as the Global Positioning System (GPS) delivering a time signal corresponding with IRIG, a WWVB or WWV system, a network-based system such as those implementing the IEEE 1588 precision time protocol, and/or the like.

A data communication channel 108 may allow the IEDs 102 and 104 to exchange information relating to, among other things, voltages, currents, and/or time-domain fault detection and location. According to some embodiments, a time signal based on either the common time source 110 or an independent internal time source may be distributed to and/or between IEDs 102 and 104 using the data communication channel 108. The data communication channel 108 may be embodied in a variety of media and may utilize a variety of communication protocols. For example, the data communication channel 108 may be embodied utilizing physical media, such as fiber optics, electric conductors (e.g., copper), or even a wireless channel. Further, the data communication channel 108 may utilize communication protocols such as Ethernet, SONET, SDH, or the like.

One or both IEDs 102 and 104 may be configured to determine a condition of the electric power system using traveling waves detected on one or more phase conductors and/or incremental quantities derived from the electric power system. The traveling waves and/or incremental quantities may be obtained from the CTs, PTs, or the like.

Figure 2A:
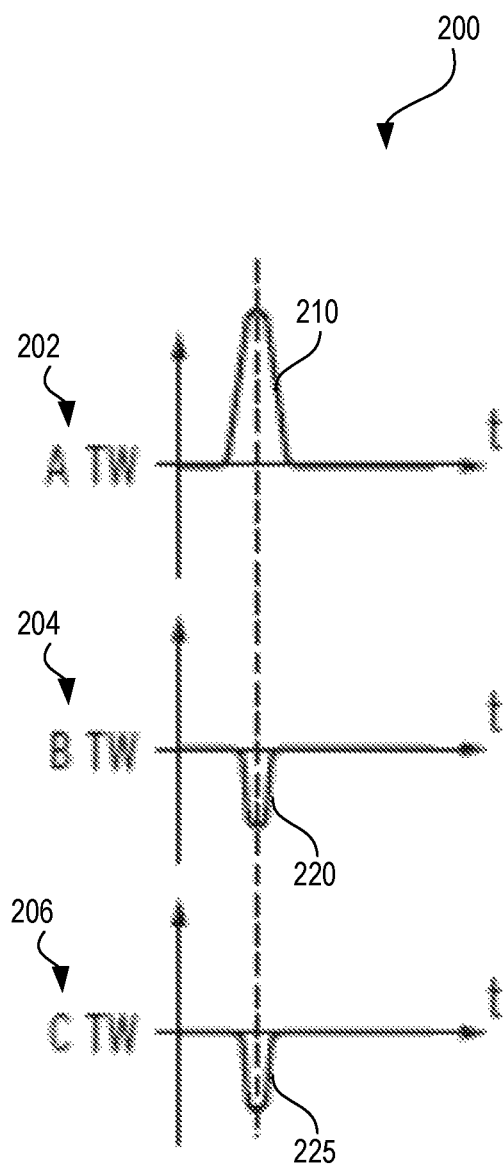
FIG. 2A illustrates example plots of traveling waves on each of three phases incidental to an event.

FIG. 2A illustrates example plots 200 of traveling waves 210, 220, and 230 on A-phase 202, B-phase 204, and C-phase 206, respectively, incidental to an event on the A-phase 202. In various embodiments, the illustrated signals that include the traveling waves 210, 220, and 230 may be filtered signals obtained from the respective phases 202, 204, and 206 from portion of an electric power delivery system. In certain embodiments, such filtering may be performed as described in one of or combination of U.S. patent application Ser. No. 14/856,350 (US Patent Application Publication No. 2016/0077149) and Ser. No. 14/856,353 (US Patent Application Publication No. 2016/0077150), each of which is hereby incorporated by reference in its entirety. The traveling waves may be time aligned, as illustrated.

FIG. 2A illustrates plots 200 of traveling wave magnitudes 210, 220, and 230 and polarities (e.g., positive or negative) over time on each of the three phases 202, 204, and 206 of the electric power delivery system during an event. The traveling wave detected on the A-phase 202 exhibits a first polarity (positive) and (relatively large) magnitude. The traveling waves 220 and 230 detected on the B-phase 204 and the C-phase 206 exhibit a second polarity opposite of the first polarity (negative), and magnitudes that are less than the magnitude of the traveling wave on the A-phase 202. Specifically, the magnitudes of the traveling waves 220 and 230 on the B-phase 204 and the C-phase 206, respectively, are approximately half the magnitude of the traveling wave 210 on the A-phase 202.

The traveling wave phase polarity pattern of the traveling waves on the three phases illustrated in FIG. 2A corresponds to either a single-phase-to-ground fault on the A-phase 202, or a three-phase fault. That is, the pattern of traveling waves illustrated in FIG. 2A could have been generated by either by an A-phase-to-ground fault or by a three-phase fault.

More generally, a detection system may identify a traveling wave pattern that includes a first traveling wave with a first polarity and first magnitude on a first phase and corresponding traveling waves on the other two (second and third) phases that are (i) opposite in polarity and (ii) for which the sum of their magnitudes is approximately equal to (or less than) the first magnitude (e.g., half each). If the traveling waves are identified as having the characteristics described above, the detection system may determine that the first phase is faulted, since a phase-to-ground fault is more probable than a three-phase fault. Alternatively, the detection system may provide an alert indicating that either a specific phase has a ground fault or that a three-phase fault exists, without necessarily specifying which.

The detection system (or another system in communication with the detection system) may trip a breaker to clear the faulted phase. For example, if the detection system (or another system in communication with the detection system) determines that a fault is a three-phase fault, the system may trip all three phases.

Figure 2B:
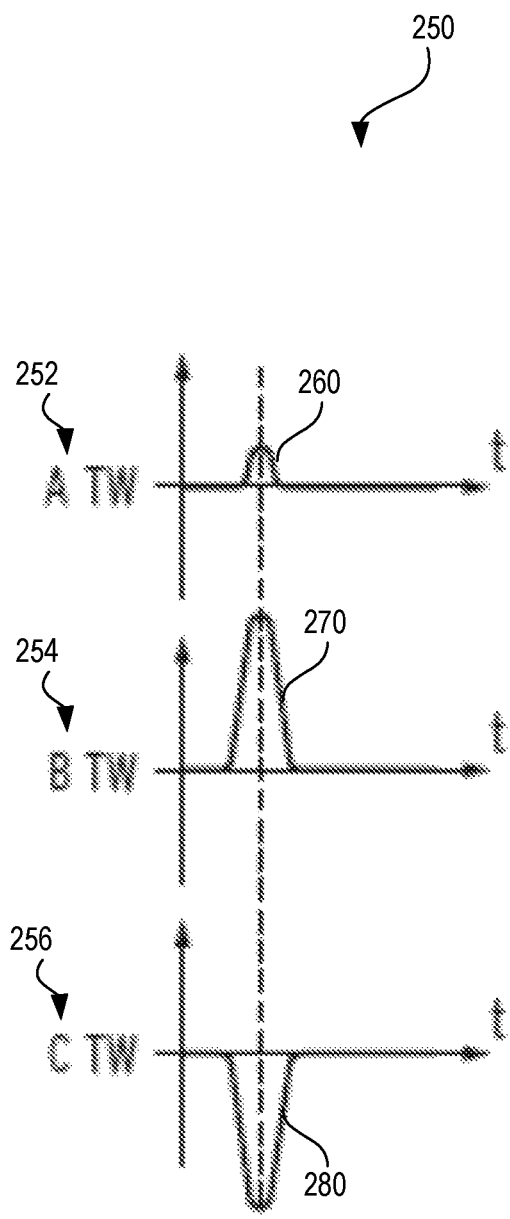
FIG. 2B illustrates example plots of traveling waves on each of three phases incidental to n different event.

FIG. 2B illustrates plots 250 of traveling waves 260, 270, and 280, including magnitudes and polarities over time, on each of the three phases 252, 254, and 256 of an electric power delivery system during a different event. The traveling wave 260 detected on the A-phase 252 exhibits a first polarity and magnitude. The traveling waves 270 and 280 on the B- and C-phases 254 and 256, respectively, exhibit magnitudes greater than the magnitude of the traveling wave on the A-phase 252. Specifically, the traveling waves 270 and 280 on the B phase 252 and the C-phase 256 each exhibit magnitudes greater than the magnitude of the traveling wave on the A-phase 252. In various embodiments, the traveling waves 270 and 280 on the B-phase 252 and the C-phase 256 each exhibit magnitudes approximately double the magnitude of the traveling wave on the A-phase 252. Further, the polarities of the traveling waves 270 and 280 detected on the B-phase 254 and the C-phase 256 are opposite one another.

A traveling wave detection system may identify the traveling wave phase polarity pattern (comprising traveling waves 260, 270, and 280) as the result of a B-phase-to-C-phase fault. Thus, the system may identify a phase-to-phase fault based on traveling waves on two phases that are approximately equal in magnitude with opposite polarities when the third phase has a traveling wave with less magnitude of that found on the other two phases. In various embodiments the third phase may have a traveling wave with approximately half of the magnitude of that found on the other two phases. The system may determine a phase-to-phase fault if the fault is not identified as single-phase to ground or a three-phase fault.

As described above, a traveling wave detection system may determine the phase selection of a fault in a traveling wave. The traveling wave detection system may further determine if the magnitude of the traveling wave on two of the phases is substantially equal (or less than), but opposite in polarity. The traveling wave detection system may further determine that the magnitude of the traveling wave on the remaining phase is lower than the magnitudes of the other two phases. In such an instance, the traveling wave detection system may identify the cause of the traveling wave phase polarity pattern as a phase-to-phase fault on the two phases with opposite, but substantially equal magnitudes.

In some embodiments, the determination may be further simplified by identifying traveling waves on first and second phases that are opposite in polarity, and identifying a traveling wave on a third phase with a magnitude less than those on the first and second phases. The system may identify the source of such a traveling wave phase polarity pattern as originating from a phase-to-phase fault, regardless of or without analyzing the magnitudes of the first and second phases relative to each other.

As previously noted, to distinguish between single-phase-to-ground faults, phase-to-phase faults, and three-phase faults, the phase selection system may be biased toward the more likely fault. It has been observed that a single-phase-to-ground fault is more likely to occur on an electric power delivery system than a three-phase fault is to occur on the same electric power delivery system. Accordingly, when a traveling wave on one phase is detected to have a magnitude greater than, and a polarity opposite of, the traveling waves detected on the other two phases (as in FIG. 2A), the system may identify the origin of the traveling waves as a single-phase-to-ground fault on the phase with the greater magnitude. The system may immediately trip the phase (e.g., cause a circuit breaker to open on) the phase with the greater magnitude.

Once the phase is tripped (e.g., circuit breaker opened), the traveling wave detection system (or other monitoring system) may continue to monitor each of the three phases to determine if the fault is a three-phase fault on the electric power delivery system. According to one embodiment, the system (or other monitoring system) may monitor incremental current and voltage quantities from each of the three phases of the electric power delivery system. If the incremental quantities indicate that the fault is a three-phase fault, then the remaining two phases may also trip (e.g., the three poles of the circuit breaker thereon may be opened). Otherwise, if the incremental quantities do not indicate a three-phase fault condition, then a single-phase-to-ground fault (or phase-to-phase fault if the pattern matches that of FIG. 2B or single phase to ground fault or three-phase fault is not identified) may be confirmed, as previously assessed based on the traveling wave phase polarity pattern.

Figure 3A:
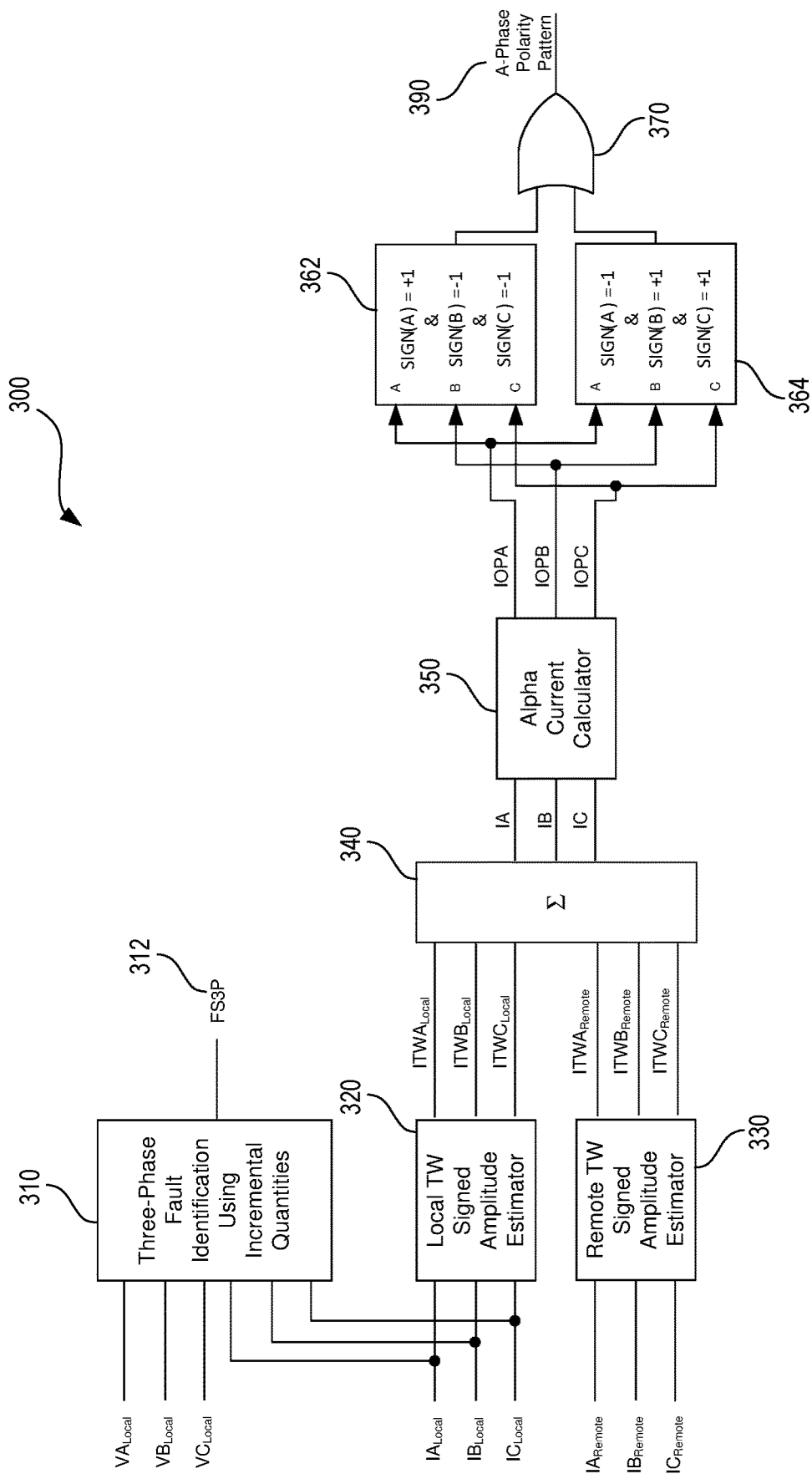
FIG. 3A illustrates an example of a logic diagram for determining a traveling wave phase polarity pattern for phase selection using local and remote quantities.

FIG. 3A illustrates an example of a logic diagram 300 of a portion of a traveling wave fault detection system for determining a traveling wave phase polarity pattern for phase selection using local and remote quantities. The illustrated embodiment illustrates an A-phase selection, but it is appreciated that similar logic could be used to determine B-phase or C-phase selections.

As previously noted, the traveling wave phase polarity pattern, or just "the pattern," may indicate the type of fault. Traveling wave operating signals from each of the three phases are used to determine the pattern. In one embodiment, the operating signals may be calculated using current signals from one or more locations in an electric power delivery system. In another embodiment, the operating signals may be calculated using current signals from a local point within the electric power delivery system and a remote point within the electric power delivery system.

In one embodiment, a traveling wave detection system may calculate a traveling wave signed amplitude on the A-phase (IA) based on a sum of a measured signed amplitude of the traveling wave on the A-phase at a local terminal (ITWA$_{Local}$) and a measured signed amplitude of the traveling wave on the A-phase at a remote terminal (ITWA$_{Remote}$). Similarly, for the B-phase, the traveling wave detection system may calculate a traveling wave signed amplitude on the B-phase (IB) based on a sum of a measured signed amplitude of the traveling wave on the B-phase at a local terminal (ITWB$_{Local}$) and a measured signed amplitude of the traveling wave on the B-phase at a remote terminal (ITWB$_{Remote}$). Finally, for the C-phase, the traveling wave detection system may calculate a traveling wave signed amplitude on the C-phase (IC) based on a sum of a measured signed amplitude of the traveling wave on the C-phase at a local terminal (ITWC$_{Local}$) and a measured signed amplitude of the traveling wave on the C-phase at a remote terminal (ITWC$_{Remote}$).

An operating signal the A-phase (IOPA) may be calculated based on one-third of the result of two times (2×) the traveling wave signed amplitude on the A-phase (IA) minus the traveling wave signed amplitude on the B-phase (IB) minus the traveling wave signed amplitude on the C-phase (IC). Thus, the operating signal for the A-phase (IOPA) may be expressed as:

$$IOPA = \frac{1}{3}(2 \cdot IA - IB - IC) \quad \text{Equation 1}$$

An operating signal the B-phase (IOPA) may be calculated based on one-third of the result of two times (2×) the traveling wave signed amplitude on the B-phase (IB) minus the traveling wave signed amplitude on the A-phase (IA) minus the traveling wave signed amplitude on the C-phase (IC). Thus, the operating signal for the B-phase (IOPB) may be expressed as:

$$IOPB = \frac{1}{3}(2 \cdot IB - IA - IC) \quad \text{Equation 2}$$

An operating signal the C-phase (IOPA) may be calculated based on one-third of the result of two times (2×) the traveling wave signed amplitude on the C-phase (IC) minus the traveling wave signed amplitude on the A-phase (IA) minus the traveling wave signed amplitude on the B-phase (IB). Thus, the operating signal for the C-phase (IOPC) may be expressed as:

$$IOPC = \frac{1}{3}(2 \cdot IC - IA - IB) \quad \text{Equation 3}$$

The polarities of the operating signals from each phase are compared. If the polarity of the A-phase operating signal (IOPA) is opposite the polarities of each of the B- and C-phase operating signals (IOPB and IOPC, respectively), then an A-traveling wave phase polarity pattern is identified (A-phase selection). Similar logic can be used to determine B- and C-traveling wave phase polarity patterns for B- or C-phase selection.

In the illustrated logic diagram 300, a local traveling wave signed amplitude estimator 320 receives local current measurements from each of three phases, IA$_{Local}$, IB$_{Local}$, and IC$_{Local}$. A remote traveling wave signed amplitude estimator 330 receive remote current measurements from each of the three phases, IA$_{Remote}$, IB$_{Remote}$, and IC$_{Remote}$. In some embodiments, the local traveling wave signed amplitude estimator 320 and the remote traveling wave signed amplitude estimator 330 are distinct components, the same component, or share some components.

The local and remote traveling wave signed amplitude estimators 320 and 330 output respective signed amplitudes of the traveling waves including ITWA$_{Local}$, ITWA$_{Remote}$, ITWB$_{Local}$, ITWB$_{Remote}$, ITWB$_{Local}$, and ITWC$_{Remote}$. Each of these values may be synonymously described as being measured, determined, or calculated. These quantities may be summed, as described above by a summation element 340 to generate traveling wave signed amplitudes for each of the three phases, IA, IB, and IC, as described above.

An alpha current calculator 350 may determine operating signals for each of the three phases, as described above, including IOPA, IOPB, and IOPC. If the polarity of the A-phase is positive and the polarities of each of the B- and C-phases is negative, at 362, or (logic 370), the polarity of A-phase is negative and the polarities of each of the B- and C-phases is positive, at 364, then an A-phase traveling wave polarity pattern 390 may be identified (i.e., A-phase selection). A phase selection subsystem to identify a selected phase may include the alpha current calculator 350 combined with the polarity comparison logic 362 and 364.

As described below, the A-phase traveling wave polarity pattern 390 may be subsequently used to identify an event originating from a A-phase-to-ground fault or a three-phase fault. The traveling wave fault detection system may include a three-phase fault identification subsystem 310 (or be in communication with a separate a three-phase fault identification system) that uses incremental quantities to identify a three-phase fault. Specifically, local voltage measurements for each of the three phases, VA$_{Local}$, VB$_{Local}$, VC$_{Local}$, and the local current measurements for each of the three phases, IA$_{Local}$, IB$_{Local}$, IC$_{Local}$, may be used to identify (or rule out) a three-phase fault. A three-phase fault signal 312 (FS3P signal) may be used as an input the logic diagram 600 illustrated in FIG. 6 and described below in greater detail.

Figure 3B:
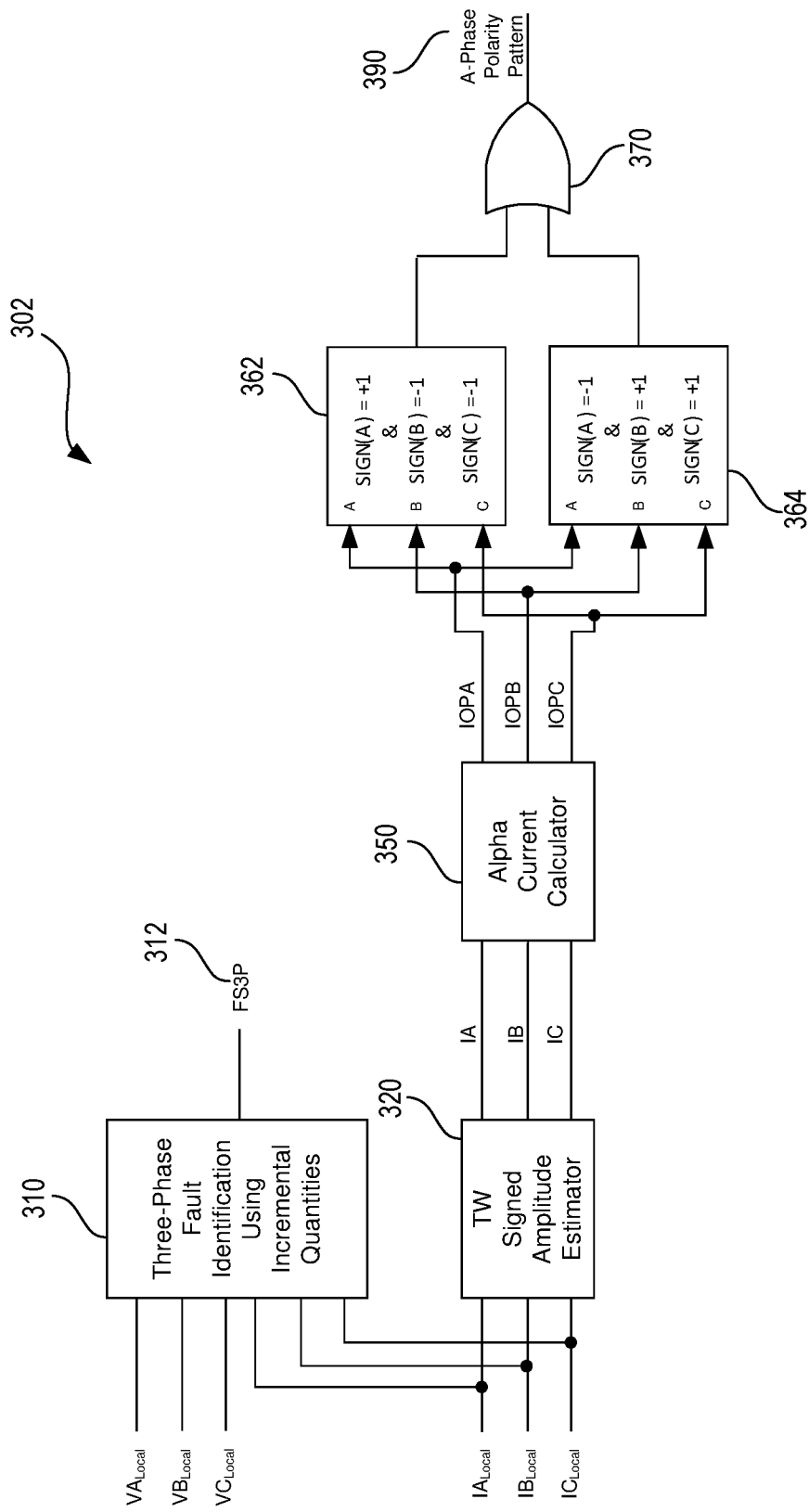
FIG. 3B illustrates an example of a logic diagram for determining a traveling wave phase polarity pattern for phase selection using local quantities.

The logic diagram 302 illustrated in FIG. 3B is similar to that illustrated in discussed in conjunction with FIG. 3A, except that only the local signals are used. As such, the remote traveling wave signed amplitude estimator 330 is omitted. In the embodiment illustrated in FIG. 3B, the traveling wave detection system may calculate a traveling wave signed amplitude on the A-phase (IA) based on a measured signed amplitude of the traveling wave on the A-Phase at a local terminal ($ITWA_{Local}$). For the B-phase, the traveling wave detection system may calculate a traveling wave signed amplitude on the B-phase (IB) based on a measured signed amplitude of the traveling wave on the B Phase at a local terminal ($ITWB_{Local}$). Finally, for the C-phase, the traveling wave detection system may calculate a traveling wave signed amplitude on the C-phase (IC) based on a measured signed amplitude of the traveling wave on the C- phase at a local terminal ($ITWC_{Local}$). Subsequent logic in the alpha current calculator 350, and decision logic 362, 364, and 370 is similar to that described in conjunction with FIG. 3A.

Figure 3C:
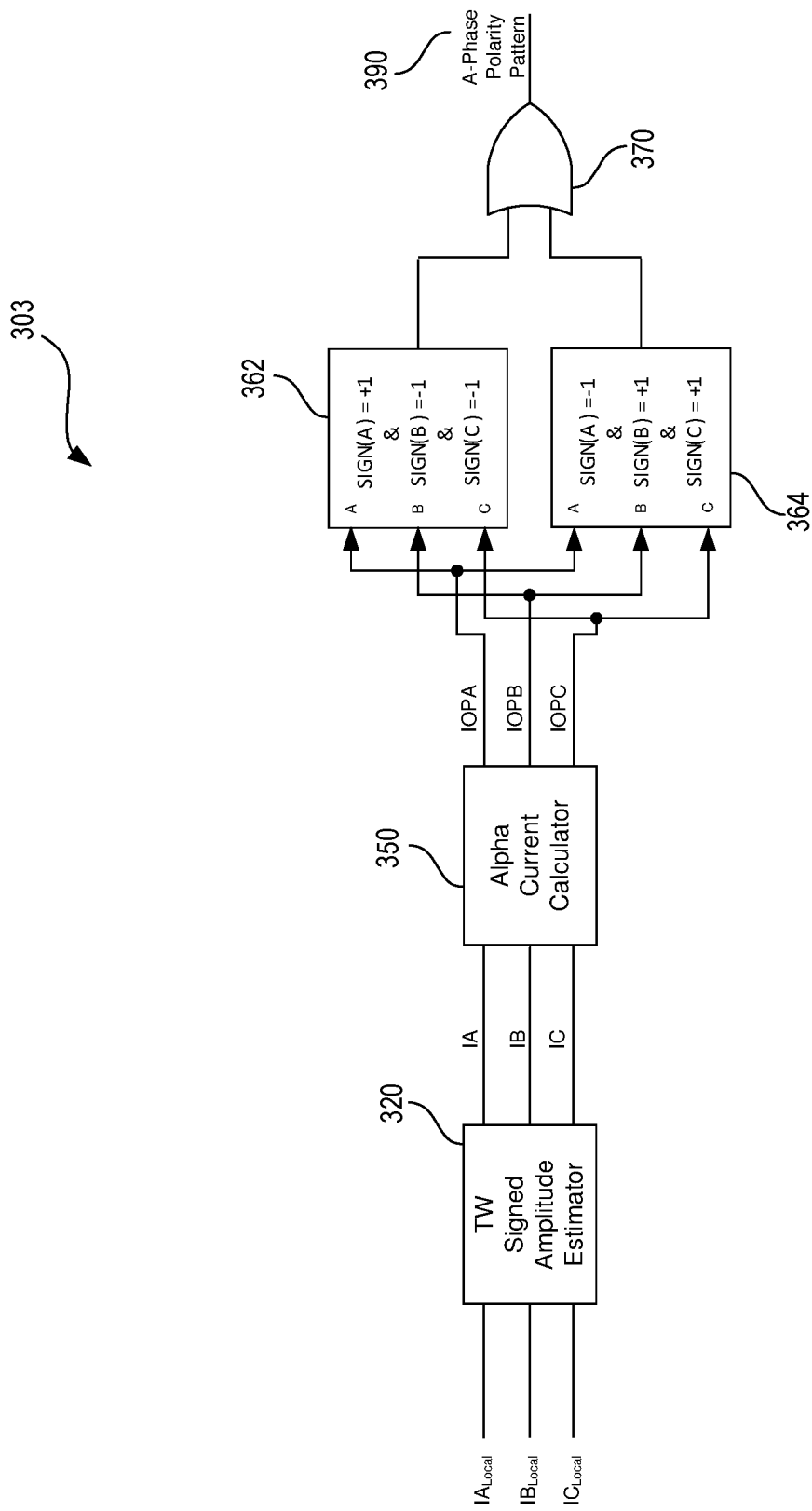
FIG. 3C illustrates another example of a logic diagram for determining a traveling wave phase polarity pattern for phase selection using local quantities.

FIG. 3C illustrates another example of a logic diagram 303 for determining a traveling wave phase polarity pattern for phase selection using local quantities. The illustrated example is similar to that illustrated in FIG. 3B, without using the three-phase fault identification using the local voltage measurements for each phase of the three phases to indicate a three-phase fault signal.

It is appreciated that the embodiments described herein may be used with any of a wide variety of protection, reporting, and monitoring techniques and systems. Thus, while many embodiments are described herein as resulting in "tripping," in most, if not all, of those embodiments, alternative protection, reporting, alarm, or monitoring steps may be taken instead of tripping. Moreover, techniques such as differential protection, directional protection, and the like may be used in combination with the systems and methods described herein. As detailed above, logic diagrams similar to any of FIG. 3A, 3B, or 3C could be used for B-phase selection or C-phase selection, as described above.

Figure 4A:
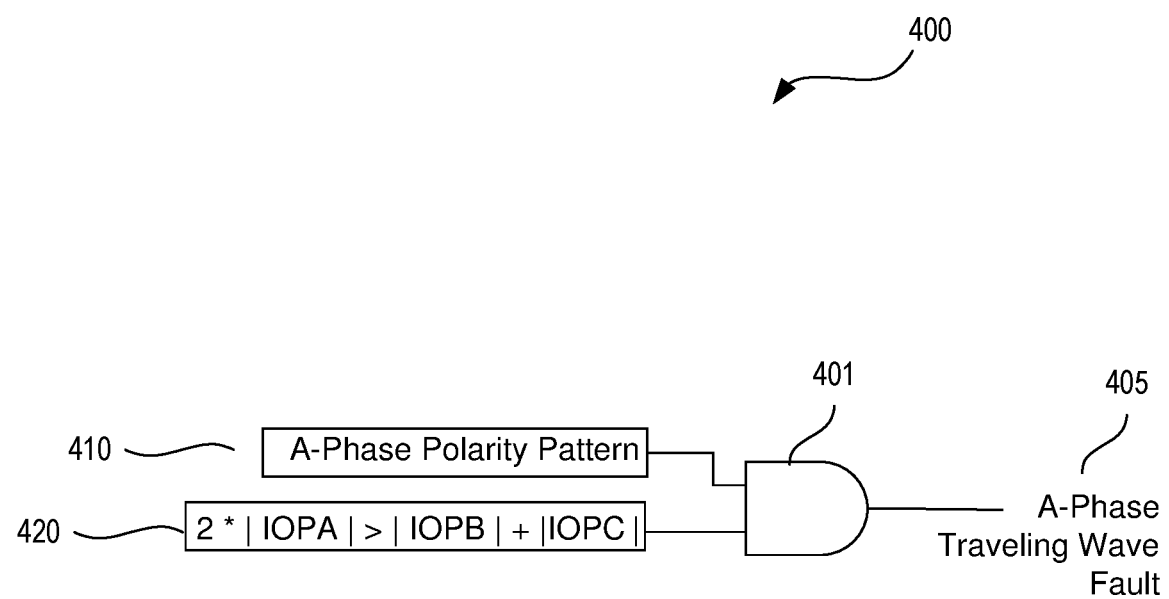
FIG. 4A illustrates an example of a logic diagram for identifying a fault using a traveling wave phase polarity pattern.

FIG. 4A illustrates simplified logic 400 that could be included in a fault detector module or subsystem that uses the magnitudes of the operating signals 401 for determining an A-phase traveling wave fault 405 based on an A-phase traveling wave polarity pattern (A-phase selection) as described in any variation of any of FIGS. 3A, 3B, and/or 3C. In the embodiment illustrated in FIG. 4, if twice the magnitude of the A-phase operating signal IOPA is greater than the sum of the magnitudes of the B- and C-phase operating signals, at 420, AND 401 the A-traveling wave phase polarity pattern was determined 410, then an A-phase traveling wave fault may be declared.

In some embodiments, the expression used may be "greater than or equal to," such that if twice the magnitude of the A-phase operating signal IOPA is greater than or equal to the sum of the magnitudes of the B- and C-phase operating signals, at 420, AND 401 the A-traveling wave phase polarity pattern was determined 410, then an A-phase traveling wave fault may be declared.

Figure 4B:
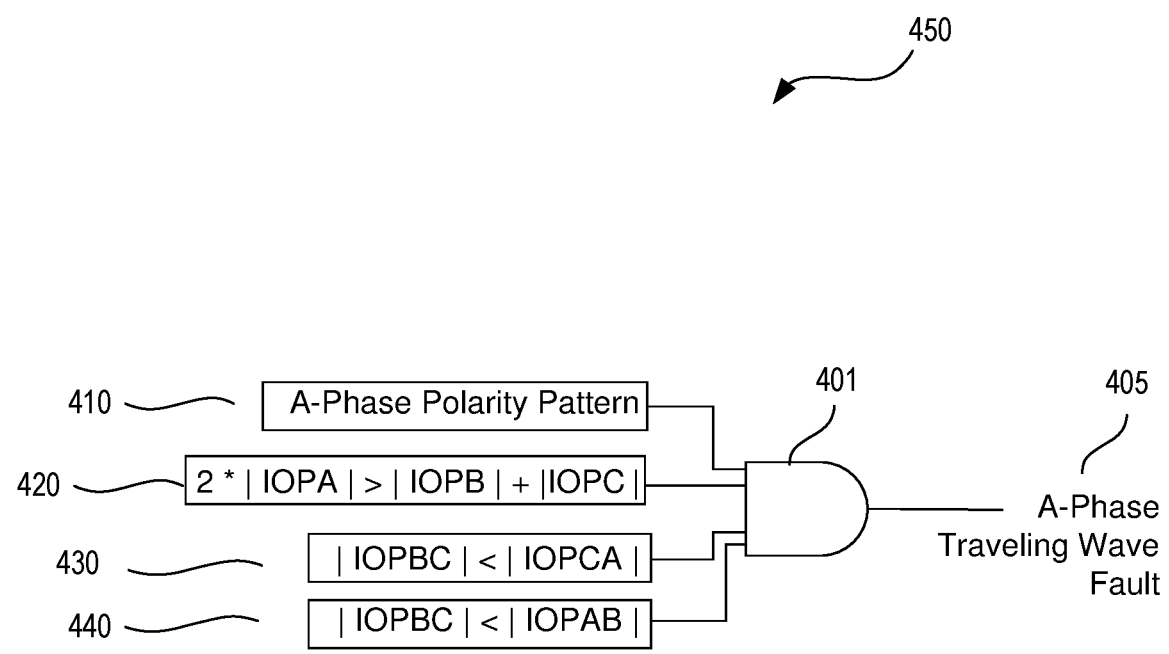
FIG. 4B illustrates an example of another logic diagram for identifying a fault using a traveling wave phase polarity pattern.

FIG. 4B illustrates another embodiment of logic 450 that can be implemented by a fault detector subsystem or module, in which the A-phase traveling wave may be declared if the two conditions are met in 410 and 420 described in FIG. 4A, AND 401 the magnitude of a B-C phase operating signal is less than (or optionally: less than or equal to) the magnitude of a C-A phase operating signal 430 AND 401 the B-C phase operating signal is less than (or optionally: less than or equal to) the magnitude of an A-B phase operating signal 440. In the above description, and as illustrated in FIG. 4B, a B-C phase operating signal is the difference between the B-phase operating signal IOPB and the C-phase operating signal IOPC. Similarly, the C-A phase operating signal is the difference between the C-phase operating signal IOPC and the A-phase operating signal IOPA. The A-B phase operating signal is the difference between the A-phase operating signal IOPA and the B-phase operating signal IOPB.

As before, similar logic to the examples described in conjunction with FIGS. 4A and 4B may be used to determine B-phase traveling wave faults and C-phase traveling wave faults. If none of the A-, B-, or C-phase traveling wave signals are asserted (e.g., no A-phase, B-phase, or C-phase fault-to-ground conditions are identified), a phase-phase fault may be declared. In some embodiments, if one of the A-phase, B-phase, or C-phase traveling wave polarity patterns is identified (i.e., A-phase selection, B-phase selection, or C-phase selection), then either a phase-to-ground fault will be declared (e.g., via satisfaction of the logic in FIG. 4B) or a phase-to-phase fault is declared unless and/or until a three-phase fault is identified using incremental quantities, as described herein (e.g., via the three-phase fault identification subsystem 310 in FIGS. 3A and 3B).

In some embodiments, a single phase may trip in response to a detection of a fault while confirmation of a three-phase fault or the ruling out of a three-phase fault is being determined. In other embodiments, all three phases may be tripped as a precautionary measure. In still other embodiments, all tripping (or other protective measures) may await confirmation of whether the event is a phase-to-ground fault, phase-to-phase fault, or a three-phase fault.

Figure 5:
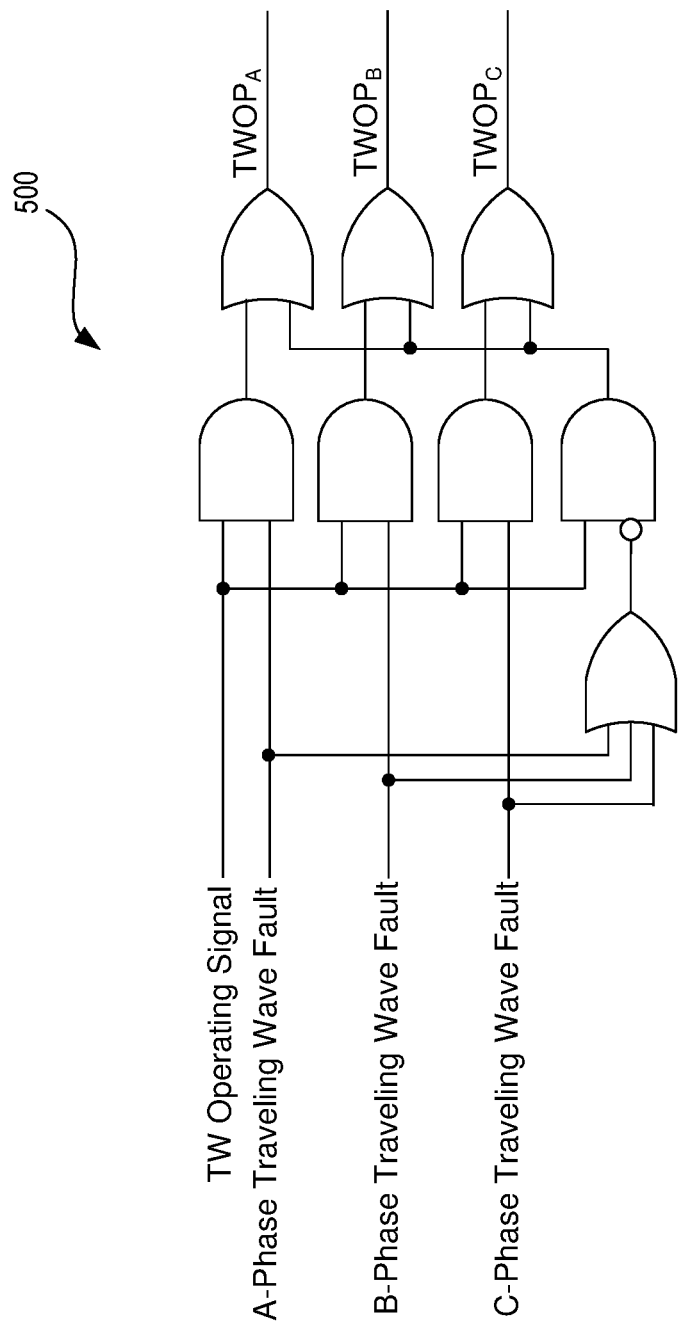
FIG. 5 illustrates another example of a logic diagram for phase selection.

FIG. 5 illustrates a logic diagram 500 for further conditioning of a traveling wave signal that may be used according to various embodiments. A traveling wave operating signal indicative of a fault, as well as: the A-phase traveling wave fault signal (e.g., from FIG. 4B), a B-phase traveling wave fault signals from logic similar to that illustrated in FIG. 4B, and C-phase traveling wave fault signals from logic similar to that illustrated in FIG. 4B may be used to further condition a traveling wave fault signal. An A-phase traveling-wave fault signal ($TWOP_A$) may be declared when the A-phase traveling wave fault signal is asserted and the traveling wave operating signal is asserted. A B-phase traveling-wave fault signal ($TWOP_B$) may be declared when the B-phase traveling wave signal is asserted and the traveling wave operating signal is asserted. A C-phase traveling-wave fault signal ($TWOP_C$) may be declared when the C-phase traveling wave signal is asserted and the traveling wave operating signal is asserted. If the traveling wave operating signal is asserted and none of the A-phase traveling wave fault signal, B-phase traveling wave fault signal, and C-phase traveling wave fault signals are asserted, then each of the A-, B-, and C-phase traveling wave operating signals are asserted.

Figure 6:
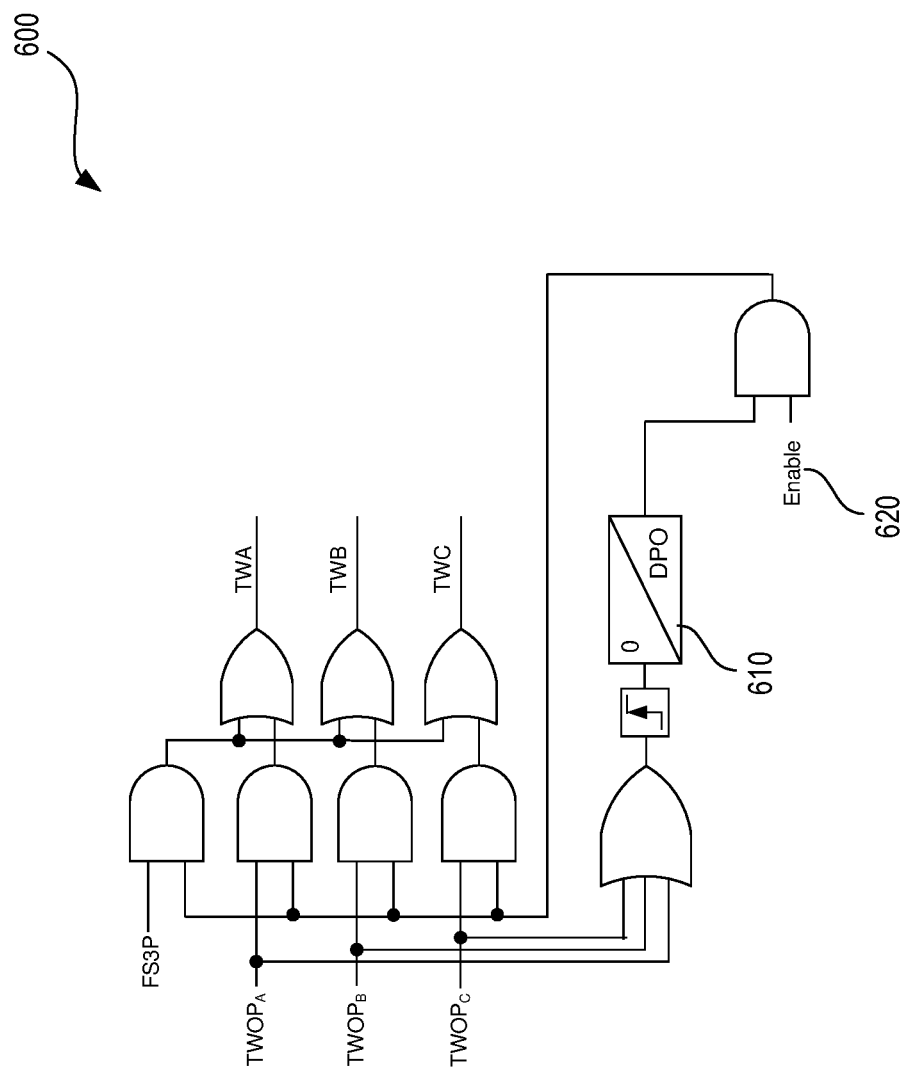
FIG. 6 illustrates an example of a logic diagram for protective action using phase selection.

FIG. 6 illustrates a logic diagram 600 for further operation on the output signals in FIG. 5 and either of FIGS. 3A and 3B. In particular, the A-, B-, and C-phase traveling wave signals ($TWOP_A$, $TWOP_B$, and $TWOP_C$) from FIG. 5 are supervised by the three-phase fault signal 312 in FIGS. 3A and 3B before a traveling wave protective action is taken. Under certain conditions, a phase traveling wave protective action TWOP may be taken on the phase or phases where the traveling wave is detected. Alternatively, a three-phase protective action assertion of TWA, TWB, and/or TWC may be taken if the logic indicates a three-phase fault.

For instance, if one or more of the traveling wave signals $TWOP_A$, $TWOP_B$, or $TWOP_C$ asserts, a timer 610 may begin. Upon lapse of the timer 610, if the traveling wave signal is still asserted, a traveling wave protective signal TWOP may be asserted. Furthermore, if the three-phase fault signal FS3P is asserted, and the timer 610 asserts, then traveling wave A-, B-, and/or C-phase outputs may assert. The timer 610 may be further supervised by a separate system, thus requiring an enable signal 620 such as, for example, a current supervision signal. The timer 610 may be configured with a dropout value sufficiently long for a three-phase fault to be detected using incremental quantities, as described herein and specifically with reference to FIGS. 3A and 3B.

Figure 7:
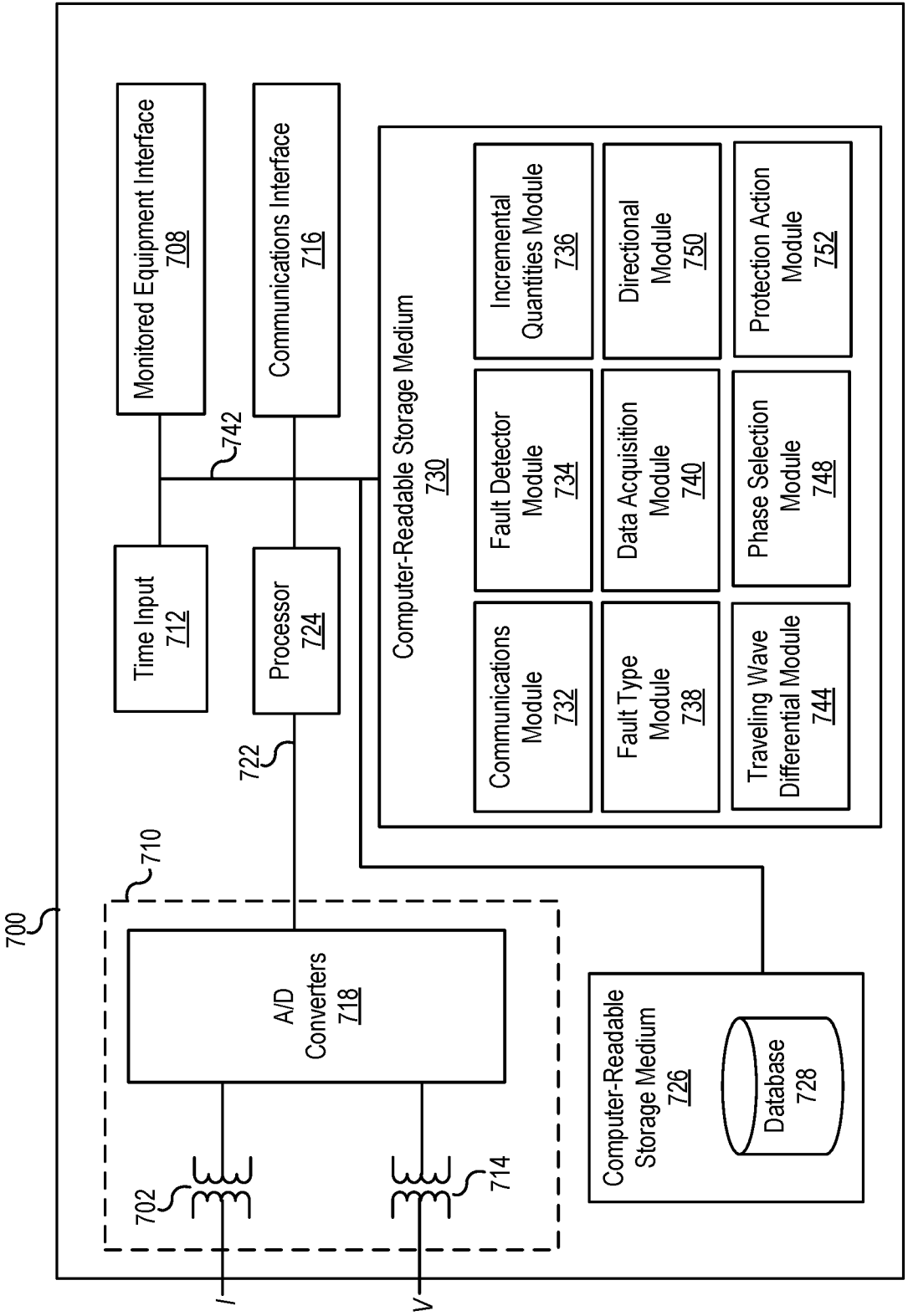
FIG. 7 illustrates an example of a block diagram of an intelligent electronic device (IED) to implement various functionalities described herein.

FIG. 7 illustrates a functional block diagram of a system 700 for detecting and locating faults using time-domain quantities consistent with embodiments of the present disclosure. In certain embodiments, the system 700 may comprise an IED system configured to, among other things, obtain and calculate time-domain quantities, detect and locate faults using a time-domain distance module, detect and locate faults using a time-domain directional module, and/or detect and locate faults using traveling waves. System 700 may be implemented using hardware, software, firmware, and/or any combination thereof. In some embodiments, system 700 may be embodied as an IED, while in other embodiments, certain components or functions described herein may be associated with other devices or performed by other devices. The specifically illustrated configuration is merely representative of one embodiment consistent with the present disclosure.

System 700 includes a communications interface 716 configured to communicate with devices and/or IEDs. In certain embodiments, the communications interface 716 may facilitate direct communication with other IEDs or communicate with systems over a communications network. Communications interface 716 may facilitate communications through a network. System 700 may include a time input 712, which may be used to receive a time signal (e.g., a common time reference) allowing system 700 to apply a time-stamp to the acquired samples, actions, and/or various data. In certain embodiments, a common time reference may be received via communications interface 716, and accordingly, a separate time input 712 may not be required for time-stamping and/or synchronization operations. One such embodiment may employ the IEEE 1588 protocol. A monitored equipment interface 708 may be configured to receive status information from, and issue control instructions to, a piece of monitored equipment (such as a circuit breaker, conductor, transformer, or the like).

Processor 724 may be configured to process communications received via communications interface 716, the time input 712, and/or monitored equipment interface 708. Processor 724 may operate using any number of processing rates and architectures. Processor 724 may be configured to perform various algorithms, calculations, characterizations, identifications, and/or determinations described herein. Processor 724 may be embodied as a general purpose integrated circuit, an application specific integrated circuit, a field-programmable gate array, and/or any other suitable programmable logic device.

In certain embodiments, system 700 may include a sensor component 710. In the illustrated embodiment, sensor component 710 is configured to gather data directly from conventional electric power system equipment such as a conductor (not shown) using conventional PTs and/or CTs. The sensor component 710 may use, for example, transformers 702 and 714 and A/D converters 718 that may sample and/or digitize filtered waveforms to form corresponding digitized current and voltage signals provided to data bus 722. Current (I) and voltage (V) inputs may be secondary inputs from conventional instrument transformers such as, CTs and VTs. A/D converters 718 may include a single A/D converter or separate A/D converters for each incoming signal from one or more phases and from one or more locations on each of the one or more phases. A current signal may include separate current signals from each phase of a three-phase electric power system. A/D converters 718 may be connected to processor 724 by way of data bus 722, through which digitized representations of current and voltage signals may be transmitted to processor 724. In various embodiments, the digitized current and voltage signals may be used to calculate time-domain quantities for the detection and the location of a fault on an electric power system as described herein.

A computer-readable storage medium 726 may be the repository of a database 728 containing electric power line properties for each transmission line and/or each section of each transmission line, such as impedances, resistances, propagation times, reactances, lengths, and/or the like. Another computer-readable storage medium 730 (or portion of the same storage medium) may be the repository of various software modules configured to perform any of the methods described herein. A data bus 742 may link monitored equipment interface 708, time input 712, communications interface 716, and computer-readable storage mediums 726 and 730 to processor 724.

Computer-readable storage mediums 726 and 730 may be separate mediums, as illustrated in FIG. 7, or may be the same medium (i.e. the same disk, the same non-volatile memory device, or the like). Further, the database 728 may be stored in a computer-readable storage medium that is not part of the system 700, but that is accessible to system 700 using, for example, communications interface 716.

Communications module 732 may be configured to allow system 700 to communicate with any of a variety of external devices via communications interface 716. Communications module 732 may be configured for communication using a variety of data communication protocols (e.g., UDP over Ethernet, IEC 61850, etc.).

Data acquisition module 740 may collect data samples such as the current and voltage quantities and the incremental quantities. The data samples may be associated with a timestamp and made available for retrieval and/or transmission to a remote IED via communications interface 716. Traveling waves may be measured and recorded in real-time, since they are transient signals that dissipate rapidly in an electric power delivery system. Data acquisition module 740 may operate in conjunction with fault detector module 734. Data acquisition module 740 may control recording of data used by the fault detector module 734. According to one embodiment, data acquisition module 740 may selectively store and retrieve data and may make the data available for further processing. A data acquisition module 740 or subsystem may include one or more electrical monitoring devices or receive electrical condition measurement data from one or more external electrical monitoring devices. Electrical monitoring devices, such as PTs and CTs, may measure voltage, current, frequency, rates of change, and/or other electrical conditions associated with one or more of the phases. Fault detector module 734 may perform various processing and/or determining steps, such as the occurrence of a fault with an electric power distribution system, as described in conjunction with one or more of FIGS. 3A-6.

An incremental quantities module 736 may be configured to calculate time domain incremental quantities based on the techniques disclosed herein. The incremental quantities module 736 may be configured to use digitized representations of current and/or voltage measurements to calculate incremental quantities therefrom, as described in conjunction with the three-phase fault identification system 310 in FIGS. 3A and 3B. In some embodiments, system 700 may be one of a pair of IEDs in communication with different terminals on an electric power system such as the IEDs and system of FIG. 1.

In one embodiment, each IED of a pair of IEDs calculates incremental quantities in its own incremental quantities module 736 for later processing and sharing between the IEDs. In another embodiment, system 700 may receive digitized representations from both the sensor component 710 and from a remote IED over a communications channel, and the incremental quantities module 736 may be configured to calculate incremental signals from both sources to calculate both local and remote incremental quantities.

A fault type module 738 may be configured to determine a fault type using incremental quantities from module 736. Fault type module 738 may use the techniques disclosed herein, to determine a fault type and provide the proper incremental quantities to use for other processing within the IED.

Traveling wave differential module 744 may determine a control operation to take due to occurrence of a fault by determining a presence of an internal fault using current quantities in traveling wave differential calculations.

A directional module 750 may be configured to determine a direction (forward or reverse) to a fault. The directional module 750 may be configured to use incremental quantities from incremental quantities module 736 to determine a direction to a fault. In other embodiments, directional module 750 may be configured to determine the direction based on the polarity of traveling waves. In such embodiments, the polarities of the voltage and current traveling waves are opposite if the fault is in the forward direction. If the fault is in the reverse direction, the voltage and current traveling waves may have the same polarity.

A protective action module 752 may be configured to implement a protective action based on the declaration of a fault by the fault detector module 734. In various embodiments, a protective action may include tripping a breaker, selectively isolating a portion of the electric power system, etc. In various embodiments, the protective action module 752 may coordinate protective actions with other devices in communication with system 700.

In various embodiments, system 700 may be configured to provide protection based on instantaneous voltages and currents. Such signal components require shorter data windows but facilitate faster protection. Various embodiments of system 700 may be configured to achieve an operating time of approximately 1 millisecond, or less. Such a system may utilize a lumped parameter circuit-based and TW-based time-domain approach and may allow for versatile applications covering various relay input voltage sources and available communications channels. Such a system may utilize high sampling rates MHz), high-resolution (≥16 bits) synchronized sampling, high-fidelity time synchronization, and a communications network capable of exchanging all acquired data (≥1 Mbps), or high numeric burden required by some of the algorithms (≥1 G multiplications per second).

A phase selection module 748 may be configured to receive current signals from the data acquisition module 740. The phase selection module 748 may be configured to select a phase or phases in accordance with the embodiments described herein. The phase selection module 748 may be in communication with several of the modules for sharing different signals therewith. Furthermore, the phase selection module 748 may be in communication with the protective action module 752, which may be configured to operate certain equipment in response to outputs of the phase selection module 748 when a fault is detected.

Although several embodiments discussed hereinabove refer to three phases of an alternating-current electric power delivery system, the principles herein may be applied to a multiple-phase alternating-current electric power system having more or less than three phases. For example, a four-phase electric power delivery system is contemplated, as is a six-phase electric power delivery system. The principles taught herein may be applied. In other embodiments, the principles taught may be applied to a direct-current electric power delivery system. In particular, traveling wave detection using currents only in a traveling wave differential module may use current quantities from a direct-current electric power delivery system to detect faults and take control actions, protective actions, reporting actions, etc. thereon.

While specific embodiments and applications of the disclosure have been illustrated and described, it is understood that the disclosure is not limited to the precise configurations and components disclosed herein. For example, the systems and methods described herein may be applied to an industrial electric power delivery system or an electric power delivery system, such as those implemented in a boat or oil platform, that may not include long-distance transmission of high-voltage power. Moreover, principles described herein may also be utilized for protecting an electric system from over-frequency conditions, wherein power generation would be shed, rather than load, to reduce effects on or stabilize the system. Accordingly, many changes may be made to the details of the above-described embodiments without departing from the underlying principles of this disclosure. The scope of the present invention(s) should, therefore, be determined to encompass the following claims.

What is claimed is:

1. A method, comprising:
   receiving, from one or more electrical monitoring devices, a plurality of representations of electrical conditions associated with traveling waves on each of three phases in a three-phase power system, including an A-phase, a B-phase, and a C-phase;
   determining, via a processor, signed amplitude values of the traveling waves on each of the three phases of the three-phase power system, using the plurality of representations;
   comparing polarities and magnitudes of functions of the signed amplitude values of the traveling waves on each of the three phases;
   identifying the A-phase as being in a fault condition of unconfirmed type based on a detected correlation of the traveling waves of the three phases in which:
   (i) the traveling waves of the B-phase and the C-phase are each approximately half the magnitude of the traveling wave of the A-phase, and
   (ii) a polarity of the traveling wave of the A-phase is opposite the polarities of the traveling waves of the B-phase and the C-phase;
   transmitting, via a communication device, a first signal to open a breaker of the A-phase; and
   analyzing, via a three-phase fault identification subsystem, after the breaker of the A-phase is commanded to open, incremental current and voltage quantities to confirm a fault type.

2. The method of claim 1, wherein the one or more electrical monitoring devices comprises a plurality of current transformers (CTs) to receive representations of current values on each of the three phases.

3. The method of claim 2, wherein the one or more electrical monitoring devices further comprises a plurality of potential transformers (PTs) to receive representations of voltage values on each of the three phases.

4. The method of claim 1, further comprising:
receiving a plurality of representations of electrical conditions associated with each of the three phases from a local monitoring location; and
receiving a plurality of representations of electrical conditions associated with each of the three phases from a remote monitoring location,
wherein determining the signed amplitude value of the traveling wave on each of the three phases comprises a determination based on a summation of an amplitude of a traveling wave at the local monitoring location and an amplitude of a traveling wave at the remote monitoring location, for each of the three phases.

5. The method of claim 1, wherein identifying the selected phase comprises, at least in part, calculating an operating signal value for each of the three phases, wherein the operating signal value for each phase is equal to one third of:
the result of two times the signed amplitude value of each respective phase minus the signed amplitude values of the other phases.

6. The method of claim 1, further comprising:
transmitting, in response to the three-phase fault identification subsystem identifying a three-phase fault condition, a second signal to open a breaker of the B-phase and open a breaker of the C-phase.

7. A system, comprising:
a data acquisition subsystem to receive a plurality of representations of electrical conditions associated with traveling waves on each of three phases of an electric power delivery system, including an A-phase, a B-phase, and a C-phase;
a traveling wave subsystem to determine signed amplitude values of the traveling waves on each of the three phases of the electric power delivery system, using the plurality of representations;
a fault detector subsystem to detect a fault that includes at least the A-phase based on a detected correlation of the traveling waves of the three phases in which:
  (i) the traveling waves of the B-phase and the C-phase are each approximately half the magnitude of the traveling wave of the A-phase, and
  (ii) a polarity of the traveling wave of the A-phase is opposite the polarities of the traveling waves of the B-phase and the C-phase; and
a communication subsystem to transmit a first signal indicating the A-phase fault based on the detected correlation of the three phases prior to completion of an incremental quantity analysis.

8. The system of claim 7, further comprising:
a three-phase fault identification subsystem to implement an incremental quantity analysis of the three phases to identify the A-phase fault as one of:
  a single-phase-to-ground fault, and
  part of a three-phase fault that additionally includes a B-phase fault and a C-phase fault.

9. The system of claim 8, wherein the communication subsystem is further configured to transmit a second signal indicating the B-phase fault and the C-phase fault in response to identification that the A-phase fault is part of the three-phase fault.

10. A method, comprising:
receiving, from one or more electrical monitoring devices, a plurality of representations of electrical conditions associated with traveling waves on each of three phases in a three-phase power system, including an A-phase, a B-phase, and a C-phase;
determining, via a processor, signed amplitude values of the traveling waves on each of the three phases of the three-phase power system, using the plurality of representations;
comparing polarities and magnitudes of functions of the signed amplitude values of the traveling waves on each of the three phases;
identifying the A-phase as being in a fault condition of unconfirmed type based on a detected correlation of the traveling waves of the three phases in which:
  (i) the traveling waves of the B-phase and the C-phase are each approximately half the magnitude of the traveling wave of the A-phase, and
  (ii) a polarity of the traveling wave of the A-phase is opposite the polarities of the traveling waves of the B-phase and the C-phase; and
transmitting, via a communication device, a first signal to open a breaker of the A-phase prior to completion of an analysis to confirm the fault type.

11. The method of claim 10, further comprising:
analyzing, via a three-phase fault identification subsystem, incremental current and voltage quantities to identify the fault condition type.

12. The method of claim 11, further comprising:
transmitting, in response to the three-phase fault identification subsystem identifying the fault condition type as a three-phase fault condition, a second signal to open a breaker of the B-phase and open a breaker of the C-phase.

* * * * *